United States Patent
Yeh et al.

(10) Patent No.: US 7,651,254 B2
(45) Date of Patent: Jan. 26, 2010

(54) MICROCHIP MATRIX LIGHT SOURCE MODULE

(75) Inventors: Wen-Yung Yeh, Hsinchu (TW);
Hsi-Hsuan Yen, Hsinchu (TW);
Han-Tsung Hsueh, Hsinchu (TW)

(73) Assignee: Industrial Technology Research Institute (TW)

( * ) Notice: Subject to any disclaimer, the term of this patent is extended or adjusted under 35 U.S.C. 154(b) by 22 days.

(21) Appl. No.: 11/987,660

(22) Filed: Dec. 3, 2007

(65) Prior Publication Data

US 2009/0141489 A1      Jun. 4, 2009

(51) Int. Cl.
*F21V 33/00* (2006.01)

(52) U.S. Cl. ........................ 362/555; 362/800

(58) Field of Classification Search .................. 362/800
See application file for complete search history.

(56) References Cited

U.S. PATENT DOCUMENTS

| | | | |
|---|---|---|---|
| 6,410,940 B1 | 6/2002 | Jiang et al. | |
| 6,614,103 B1 * | 9/2003 | Durocher et al. | ............ 257/678 |
| 6,874,910 B2 * | 4/2005 | Sugimoto et al. | ........... 362/294 |
| 6,882,101 B2 | 4/2005 | Ragle | |
| 2003/0133300 A1 * | 7/2003 | Wang et al. | .................. 362/327 |
| 2006/0056203 A1 * | 3/2006 | Lee et al. | .................... 362/800 |
| 2006/0245188 A1 * | 11/2006 | Takenaka | ..................... 362/231 |

FOREIGN PATENT DOCUMENTS

CN      1855480 A      11/2006

OTHER PUBLICATIONS

H.W. Choi et al., "Nitride Micro-Display with Integrated Micro-Lenses," Institute of Photonics, Univ. of Strathclyde, Glasgow, phys. stat. sol. (c) 2, No. 7, pp. 2903-2906, (2005).

* cited by examiner

*Primary Examiner*—Laura Tso
(74) *Attorney, Agent, or Firm*—Finnegan, Henderson, Farabow, Garrett & Dunner, LLP

(57) ABSTRACT

A microchip matrix light source module includes at least two LEDs formed on a surface of a substrate. The light source further includes a light reflector formed on a surface upon which the LEDs are formed and interposed between the LEDs and configured to reflect and thereby redirect laterally emitted light from the two LEDs. The light reflector may include an inner body. The body may be covered, in part or in whole, with a light reflecting layer such as a metal layer. The body of the light reflector may include a layer corresponding to a layer in one of the two LEDs.

26 Claims, 6 Drawing Sheets

MICROCHIP MATRIX LIGHT SOURCE MODULE

FIELD OF THE INVENTION

This invention in general relates to microchip matrix light source modules and methods for manufacturing the same. More specifically, this invention relates to microchip light emitting diode (LED) matrix light source modules and methods for manufacturing the same.

BACKGROUND

Currently a microchip array of LED devices has drawn much attention due to its application to detectors, imaging sensors, and micro-displays. While microchip array LEDs are promising as a light source for micro-displays, several aspects may be problematic.

For example, the light energy from each LED device should be directed to an observer efficiently, i.e., the light should be collimated after it is emitted by LED devices. FIG. 1 illustrates a conventional solution for collimating light from LED devices. An array of microlenses 100 formed on LED devices 102 is proposed by Choi et al. in a paper at Phys. Stat. Sol. (c) 2, No. 7, 2903-2906, Mar. 11, 2005. A light 101 emitted from LED devices 102 can be focused to a focal point at an observer and the energy efficiency can thereby be improved. However, LED device 102 can laterally emit a light beam 104 to a nearby LED device possibly causing optical cross-talk. Such optical cross-talk may degrade the color saturation of the LED devices.

To solve the optical cross-talk problem, U.S. Pat. No. 6,882,101 proposes a structure shown in FIG. 2. An opaque material 202 is filled between LED devices 204 formed on a substrate 200. Lateral emissions of light from LED devices 204 can thereby be absorbed by the interposed opaque material 202 and an optical cross-talk can be reduced. However, since lateral light emitted by each LED device 204 is absorbed, this lateral light energy can not be used for display, and the energy efficiency is lowered.

SUMMARY

Consistent with embodiments of the present invention, there is provided a light source comprising an LED device formed on a surface of a substrate. The LED device has a tapered side portion, covered in part or in whole, with a light refractive layer.

Consistent with embodiments of the present invention, there is provided a light source comprising at least two LEDs formed on a surface of a substrate. The light source further includes a light reflector formed on a surface upon which the LEDs are formed and interposed between the LEDs and configured to reflect and thereby redirect laterally emitted light from the two LEDs. The light reflector may include an inner body. The body may be covered, in part or in whole, with a light reflecting layer such as a metal layer. The body of the light reflector may include a layer corresponding to a layer in one of the two LEDs.

Consistent with embodiments of the present invention, there is also provided a light source comprising at least two LED structures formed on a surface of a substrate. Each of the LED structures includes an LED and light benders. The light benders respectively formed adjacent to a side portion of the LED and on the surface of the substrate.

BRIEF DESCRIPTION OF THE DRAWINGS

The accompanying drawings, which are incorporated in and constitute a part of this specification, illustrate embodiments of the invention and, together with the description, serve to explain features, advantages, and principles of the invention.

In the drawings.

DESCRIPTION OF THE EMBODIMENTS

Reference will now be made in detail to the present embodiments of the invention, examples of which are illustrated in the accompanying drawings.

Consistent with embodiments of the present invention, there are provided microchip matrix light source modules having reduced optical cross-talk and improved collimated light.

Figure 1:
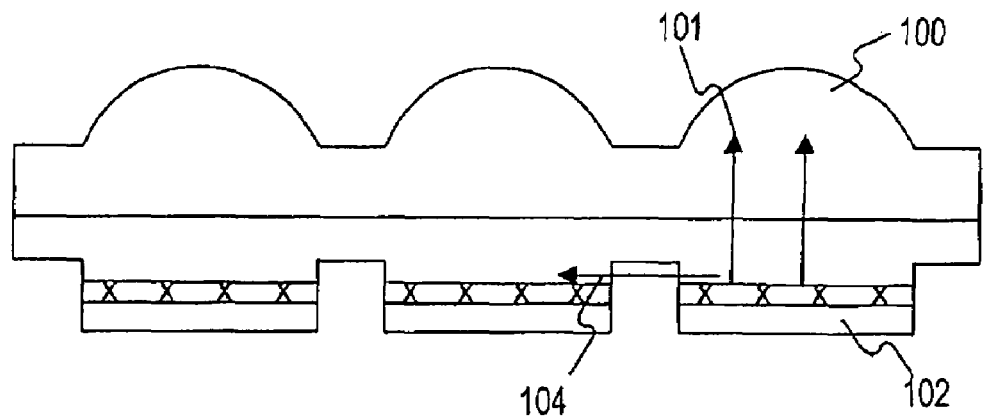
FIG. 1 shows a conventional light source including LED devices.
Figure 2:
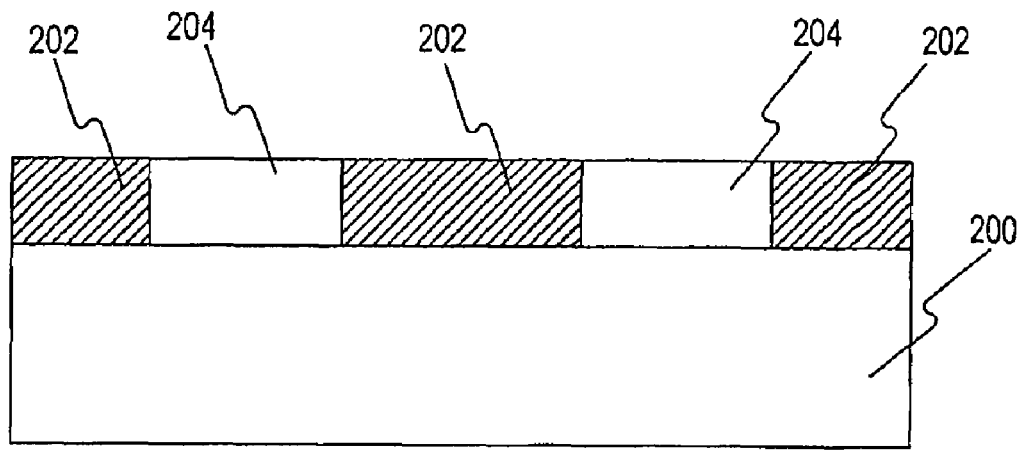
FIG. 2 shows another conventional light source including LED devices.
Figure 3:
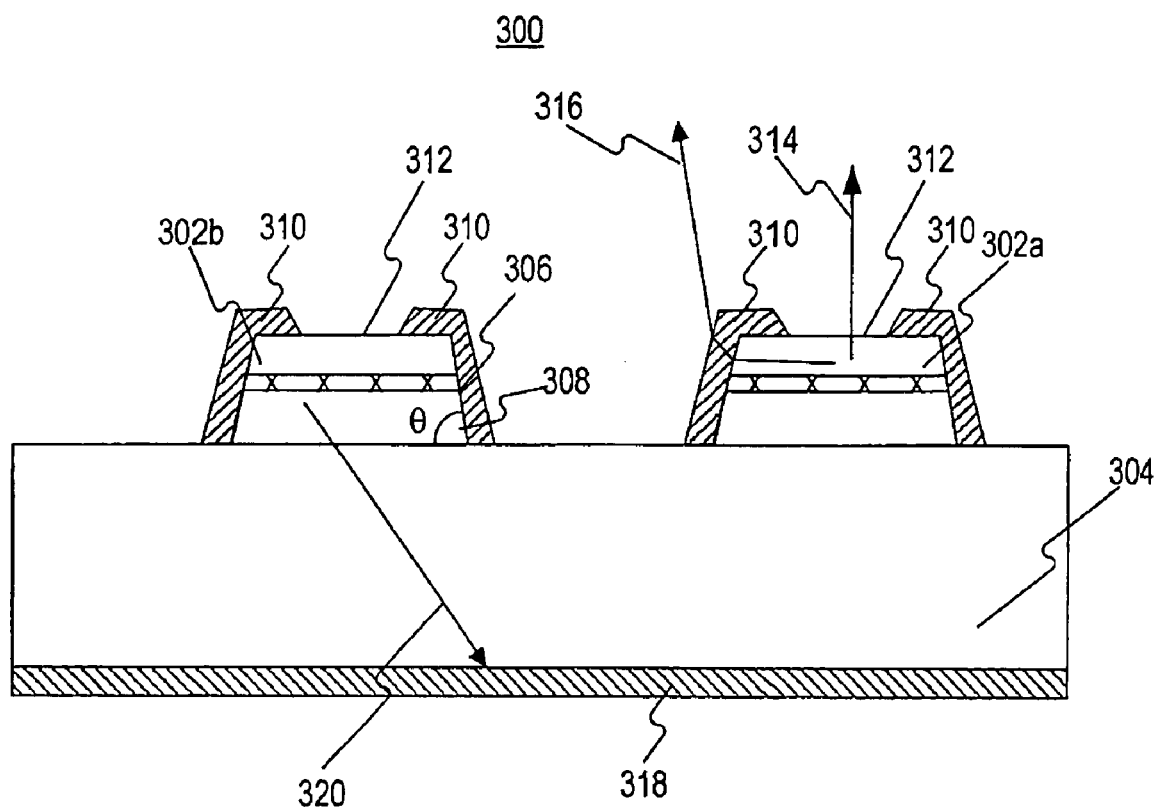
FIG. 3 shows a microchip matrix light source including LED devices consistent with embodiments of the present invention.

Referring to an embodiment shown in FIG. 3, a microchip matrix light source module 300 is illustrated. The microchip matrix light source module 300 includes multiple LED devices 302 formed on a substrate 304. To simplify the illustration, only two LED devices 302a and 302b (collectively referred to herein as LED devices 302) are shown in FIG. 3. However, the microchip matrix light source module 300 can be constructed to accommodate as many LED devices as required in a specific application. For example, a VGA resolution display may have a microchip matrix light source module 300 having a number of LED devices equal to 640×480 chips. The LED device 302 may be formed to have a tapered side portion 306. An effective taper angle θ 308 may be acute. With this tapered side portion 306 of the LED device 302, laterally emitted light can be directed away from the original propagation path toward a nearby LED device and instead toward a direction in the viewing range of an observer. Therefore, optical cross-talk between two nearby LED devices can be reduced.

Further, the tapered side portion 306 of LED devices 302 may be covered with a light refracting layer 310. A top surface 312 of LED devices 302 may not be covered with the light refracting layer 310 so that a normal light emission 314 can leave the LED devices 302 to an observer without being blocked by the light refracting layer 310. The refracting layer 310 at the tapered side portion 306 may also contribute to re-directing laterally emitted light 316 from the LED devices 302. As a result, the optical cross-talk resulting from laterally emitted light of LED devices 302 may be reduced. The material of the light refracting layer 310 may be an oxide or a nitride such as silicon oxide, silicon nitride, or a combination of silicon oxide and nitride.

According to another aspect, optical cross-talk due to back scattering of light beams emitted by LED devices 302 toward the substrate 304 can also be reduced. An example is shown in FIG. 3. A light absorption layer 318 may be formed at a second surface of the substrate opposite to the surface on which the LED devices 302 are formed. When back scattered light 320 from LED device 302b reaches the light absorption layer 318, it may be absorbed so that propagation of the back scattered light 320 to the LED device 302a is reduced.

Figure 4:
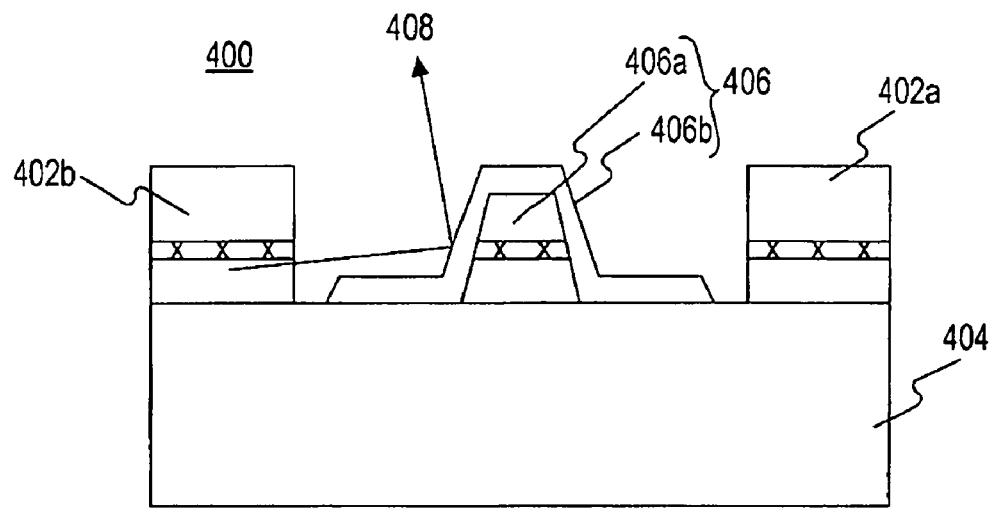
FIG. 4 shows another microchip matrix light source including LED devices consistent with embodiments of the present invention.

FIG. 4 shows another embodiment consistent with principles of the present invention. A microchip matrix light source module 400 includes multiple LED devices 402a and 402b (collectively referred to herein as LED devices 402) formed on a substrate 404. LED devices 402a and 402b may emit different colors of light. A light reflecting structure 406 may be interposed between LED devices 402a and 402b to reduce the optical cross-talk resulting from laterally emitted light from LED devices 402a and 402b. The light reflecting structure 406 may be arranged so that it does not contact the LED devices 402a and 402b. The light reflecting structure 406 includes a supporting body 406a and a light reflecting layer 406b which covers all or a portion of the supporting body 406a. The LED devices 402 may be formed by conventional deposition processes such as PVD or CVD, and isolated by conventional photolithographic techniques. The supporting body 406a may be formed using the same processes as used in the formation of the LED devices 402. According to another aspect, the supporting body 406a may be formed simultaneously by the processes that form the LED devices 402. The reflecting layer 406b may be made of any reflecting material, for example, a metal. Light 408 laterally emitted from the LED devices 402b is reflected by the reflecting layer 406b and redirected toward a direction in the viewing range of an observer. Thus reducing the possibility of propagation of the laterally emitted light to LED device 402a. In a similar manner, laterally emitted light from LED device 402a would be reflected by the reflecting layer 406b. As a result, optical cross-talk because of lateral emission between LED devices 402 can be reduced.

Figure 5:
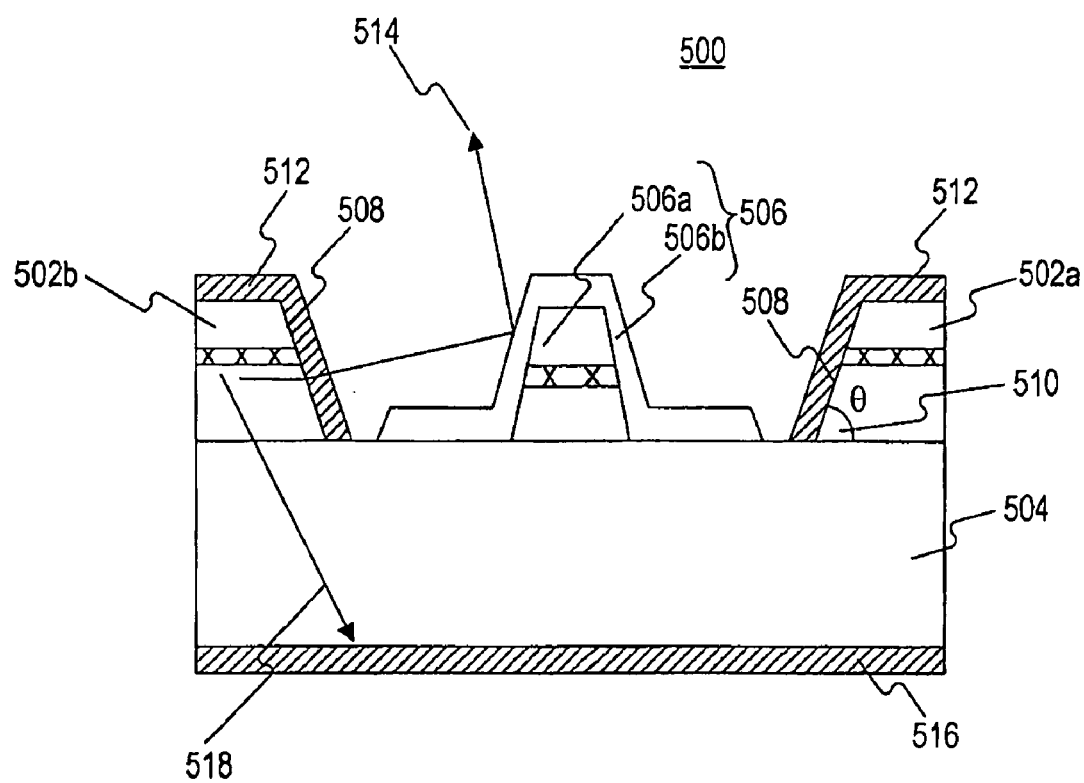
FIG. 5 shows another microchip matrix light source c including LED devices consistent with embodiments of the present invention.

According to another aspect, the lateral optical cross-talk of LED devices can be further reduced by tapering side portions of the LED devices. An example is shown in FIG. 5. A microchip matrix light source module 500 includes multiple LED devices 502a and 502b (collectively referred to herein as LED devices 502) formed on a substrate 504. The LED devices 502a and 502b emit different colors of light. A light reflecting structure 506 may be interposed between the LED devices 502a and 502b to thereby reduce the optical cross-talk resulting from laterally emitted light of the LED devices 502a and 502b. The light reflecting structure 506 may have a configuration similar to that of the light reflecting structure 406 in FIG. 4. In other words, the light reflecting structure 506 includes a supporting body 506a and a light reflecting layer 506b which covers all or a portion of the supporting body 506a. Tapered side portions 508 of the LED devices 502 may be formed to have a tapered angle θ 510. The taper angle θ 510 may be acute. In addition, the surface of each of the tapered side portions 508 of LED devices 502 may be covered, in whole or in part, with a light refracting layer 512. The material of the light refracting layer 512 may be an oxide or a nitride such as silicon oxide, silicon nitride, or a combination of silicon oxide and nitride. As shown in FIG. 5, laterally emitted light 514 from LED device 502b is bent first at the tapered portion 508 that is covered with the light refracting layer 512 and then the laterally emitted light 514 is redirected by the light reflecting structure 506 toward a direction in the viewing range of an observer, to reduce optical cross-talk. Light propagating from the LED device 502b to LED device 502a is therefore reduced.

According to another aspect, optical cross-talk due to back scattering of light beams emitted by LED devices toward the substrate 504 can also be reduced. An example is shown in FIG. 5. A light absorption layer 516 may be formed at a second surface of the substrate opposite to the surface on which the LED devices 502 are formed. When back scattered light 518 from LED device 502b reaches the light absorption layer 516, it may be absorbed so that propagation of the back scattered light 518 to the LED device 502a is reduced. Therefore, both lateral emitted and back scattered light from LED device 502b that may otherwise have been directed toward the LED device 502a is reduced because of the light reflecting structure 506 and the light absorption layer 516.

Figure 6A:
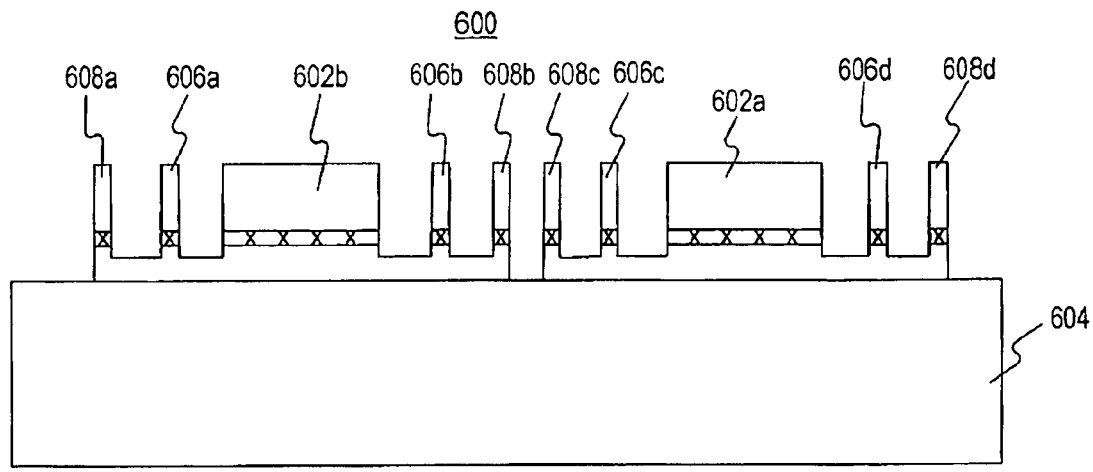
FIGS. 6a and 6b show another microchip matrix light source including LED devices consistent with embodiments of the present invention.
Figure 6B:
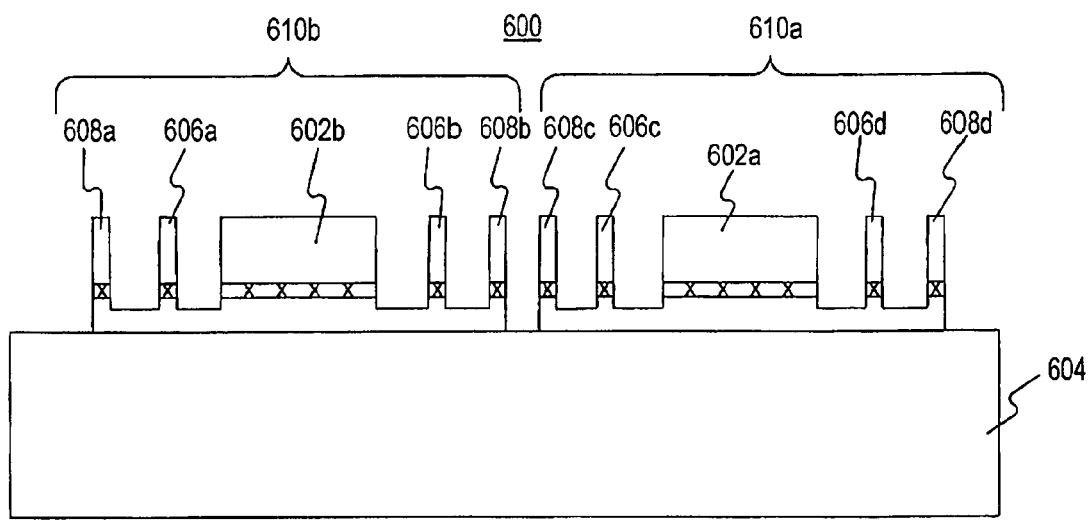

FIGS. 6a and 6b show another embodiment consistent with principles of the present invention. A microchip matrix light source module 600 includes multiple LED devices 602a and 602b (collectively referred to herein as devices 602) formed on a substrate 604. The LED devices 602a and 602b emit different colors of light. To reduce optical cross-talk resulted from lateral emissions from LED devices 602, a plurality of light benders 606a, 606b, 606c, and 606d (collectively referred to herein as light bender 606) and 608a, 608b, 608c, and 608d (collectively referred to herein as light bender 608) are positioned adjacent to the LED devices 602a and 602b. More particularly, the light benders 606a and 606b are positioned on opposite sides of and adjacent to the LED devices 602b. Similarly, the light benders 606c and 606d are positioned on opposite side of and adjacent to the LED devices 602a. The light benders 608a and 608b are positioned adjacent to and confronting the side of each of the light benders 606a and 606b, respectively, facing away from the LED device 602b. Similarly, the light benders 608c and 608bd are positioned adjacent to and confronting the side of each of the light benders 606c and 606d, respectively, facing away from the LED device 602a.

Light benders 606a-606d and 608a-608d may be formed of a photonic band gap structure. Alternatively, the combination of light benders 606a and 608a may be configured to form a photonic band gap structure. Similarly, light bender pairs 606b and 608b, 606c and 608c, and 606d and 608d may each be configured to form a photonic band gap structure.

According to another aspect of the invention, light benders 606a-606d and 608a-608d may be biased to emit light.

According to another aspect of the invention, the light benders 606 and 608 may be integrated with LED device 602 to be an LED structure 610. An example of LED structure 610 is shown in FIG. 6b. For example, LED device 602b and light benders 606a, 606b, 608a, and 608b may be integrated as an LED structure 610b. LED device 602a and light benders 606c, 606d, 608c, and 608d may be integrated as an LED structure 610a. Although only two light benders are illustrated at each side of each of the LED devices 602 in FIG. 6, one of ordinary skill in the art will now appreciate that additional light benders can be positioned to achieve collimation and enhanced isolation of laterally emitted light.

Figure 7:
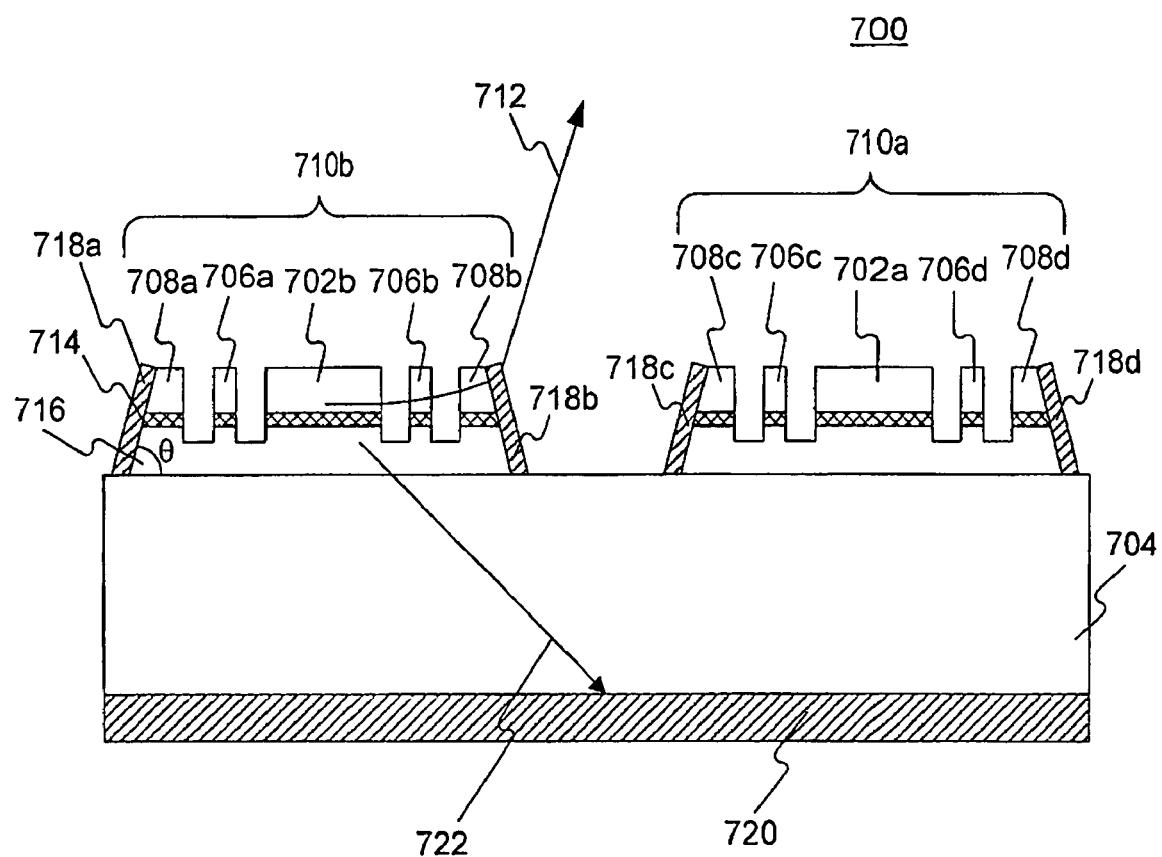
FIG. 7 shows another microchip matrix light source including LED devices consistent with embodiments of the present invention.

In addition to above embodiment, the light bending effect can be further improved by tapering the side portions of LED structures. FIG. 7 shows another embodiment consistent with principles of the present invention. A microchip matrix light source module 700 includes multiple LED devices 702a and 702b (collectively referred herein as LED devices 702) formed on a substrate 704. LED devices 702a and 702b emit different colors of light. A plurality of light benders 706a, 706b, 706c, and 706d (collectively referred to herein as light bender 706) and 708a, 708b, 708c, and 708d (collectively referred to herein as light bender 708) are positioned adjacent to the LED devices 702a and 702b. More particularly, the light benders 706a and 706b are positioned on opposite sides of and adjacent to the LED devices 702b. Similarly, the light benders 706c and 706d are positioned on opposite side of and adjacent to the LED devices 702a. The light benders 708a and 708b are positioned adjacent to and confronting the side of each of the light benders 706a and 706b, respectively, facing away from the LED device 702b. Similarly, the light benders 708c and 708bd are positioned adjacent to and confronting the side of each of the light benders 706c and 706d, respectively, facing away from the LED device 702a. Similar as in the FIG. 6b, LED device 702b and light benders 706a, 706b, 708a, and 708b may be integrated as an LED structure 710b. LED device 702a and light benders 706c, 706d, 708c, and 708d may be integrated as an LED structure 710a.

Light benders 706a-706d and 708a-708d may be formed of a photonic band gap structure. Alternatively, the combination of light benders 706a and 708a may be configured to form a photonic band gap structure. Similarly, light bender pairs 706b and 708b, 706c and 708c, and 706d and 708d may each be configured to form a photonic band gap structure.

According to another aspect of the invention, light benders 706a-706d and 708a-708d may be biased to emit light.

As illustrated in FIG. 7, side portions of the LED structure 710b may be tapered to increase the ability to bend laterally emitted light 712 from LED device 702b. For example, side portions 714 of the LED structures 710b may be tapered at an angle θ 716. The taper angle θ may be acute. To further improve light bending capability, the tapered side portions 714 may be covered, in part or in whole, with a light refracting layer 718a. As shown in FIG. 7, laterally emitted light 712 from LED device 702b may be bent upward by the light bender 706b, the light bender 708b, the tapered side portion 714 and the light refracting layer 718b.

To prevent back scattered light from entering a different colored LED device, a light absorption layer 720 may be coated on the back side of the substrate 704 as shown in FIG. 7. Back scattered light 722 from LED device 702b may be absorbed to reduce or eliminate propagation to the LED device 702a.

Consistent with another embodiment of the present invention, there are provided microchip matrix light source modules having reduced optical cross-talk and improved collimated lights. Referring to an embodiment shown in FIG. 8, there is shown a microchip matrix light source module 800 including multiple LED devices 802a and 802b (collectively referred herein as LED devices 802) formed on a substrate 804. The LED devices 802a and 802b emit different colors of light. Also formed on the substrate at each side of each of the LED devices 802 are a plurality of light benders. More particularly, the light benders 806a and 806b are positioned on opposite side of and adjacent to the LED devices 802b. Similarly, the light benders 806c and 806d are positioned on opposite sides of and adjacent to the LED devices 802a. The light benders 808a and 808b are positioned adjacent to and confronting the side of each of the light benders 806a and 806b, respectively, facing away from the LED device 802b. Similarly, the light benders 808c and 808bd are positioned adjacent to and confronting the side of each of the light benders 806c and 806d, respectively, facing away from the LED device 802a. Light benders 806a-806d and 808a-808b may be formed of a photonic band gap structure and may be substantially transparent. LED device 802b and light benders 806a, 806b, 808a, and 808b may be integrated as an LED structure 810b. LED device 802a and light benders 806c, 806d, 808c, and 808d may be integrated as an LED structure 810a. A side portion of each of the LED structures 810a and 810b may be formed to have a tapered portion 814. The surface of each of tapered portions 814 may be covered with a light refracting layer 816.

In addition, a light reflecting structure 820 may be formed to be interposed between the LED structures 810a and 810b. The light reflecting structure 820 includes a supporting body 820a and a light reflecting layer 820b which may cover, in whole or in part, the supporting body 820a. As a result, laterally emitted light 812 from LED device 802b can be bent by the light bender 806b, 808b, tapered side portion 814, and light refracting layer 816b, and be redirected by the light reflecting structure 820. Optical cross-talk can thereby be reduced.

Figure 8:
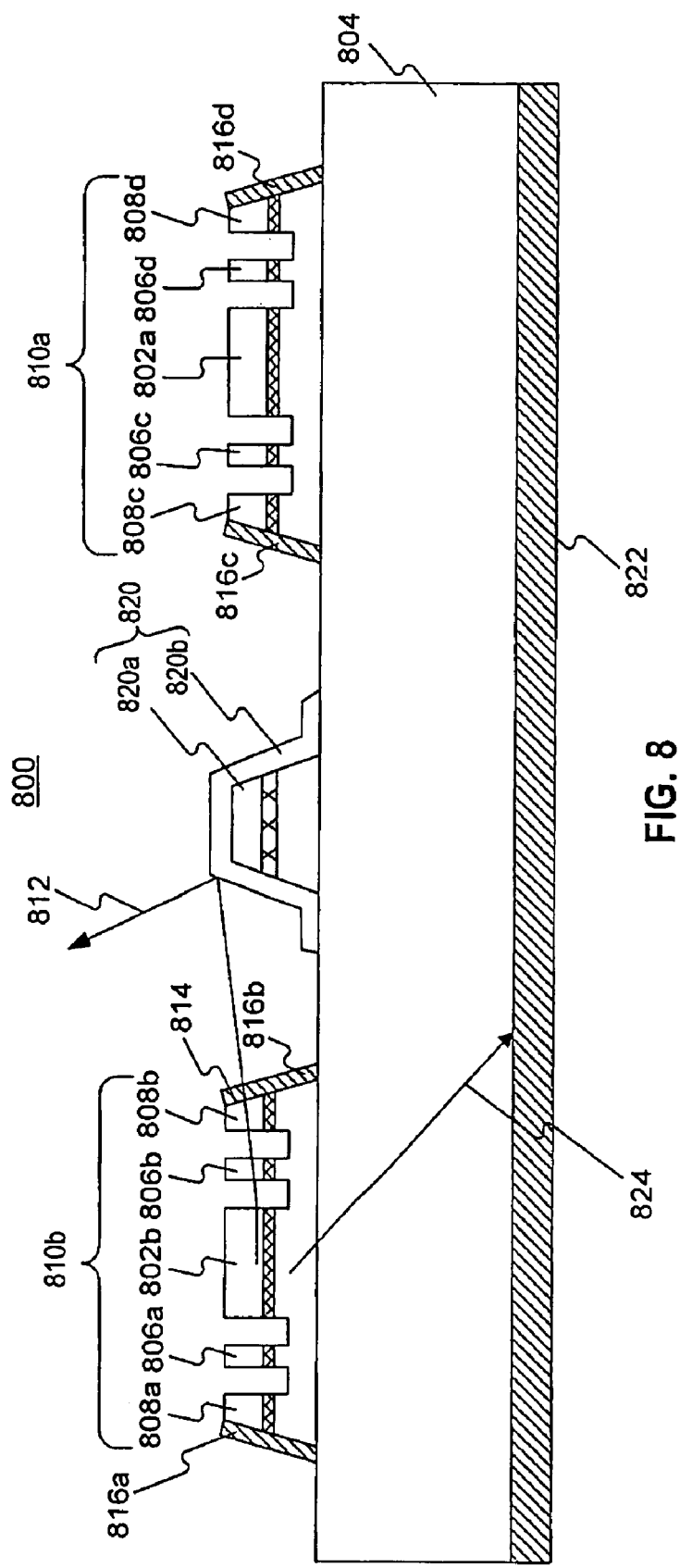
FIG. 8 shows another microchip matrix light source including LED devices consistent with embodiments of the present invention.

To prevent back scattered light from entering a different colored LED device, a light absorption layer 822 may be coated on the back side of the substrate 804 as shown in FIG. 8. Back scattered light 824 from LED device 802b may be absorbed by layer 822 to reduce or eliminate propagation to the LED device 802a.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A light source comprising:
 a substrate;
 at least two light emitting diodes formed on a surface of the substrate, wherein each of the light emitting diodes includes a tapered side portion; and
 a light refracting material on the tapered side portion of the light emitting diode.

2. The light source of claim 1, wherein each of the two light emitting diodes is adapted to emit a different color of light.

3. The light source of claim 1, wherein the light refracting material is selected from a group consisting of silicon oxide, silicon nitride, and a combination of silicon oxide and silicon nitride.

4. The light source of claim 1, further comprising a light absorbing layer formed on a surface of the substrate opposite to the surface upon which the light emitting diodes are formed.

5. The light source of claim 1, wherein the tapered side portion forms an acute angle with the surface of the substrate.

6. A light source comprising:
 a substrate;
 at least two light emitting diodes deposited on a surface of the substrate; and
 a light reflector formed on the surface of the substrate and interposed between the two light emitting diodes, the light reflector being configured to redirect at least a portion of emitted light from at least one of the two light emitting diodes.

7. The light source of claim 6, wherein each of the two light emitting diodes is adapted to emit a different color of light.

8. The light source of claim 6, wherein the light reflector comprises:
- an inner body including a layer corresponding to a layer in one of the two light emitting diodes; and
- a light reflecting layer covering at least a portion of the inner body.

9. The light source of claim 6, wherein a side portion of one of the two light emitting diodes is tapered.

10. The light source of claim 9, wherein the tapered side portion forms an acute angle with the surface of the substrate.

11. The light source of claim 9, wherein the side portion is at least partially covered with a light refracting layer.

12. The light source of claim 11, wherein the light refracting layer is formed of a material selected from a group consisting of silicon oxide, silicon nitride, and a combination of silicon oxide and silicon nitride.

13. The light source of claim 6, further comprising a light absorbing layer formed on a surface of the substrate opposite to the surface upon which the light emitting diodes are formed.

14. A light source comprising:
- a substrate; and
- at least two light emitting diode structures formed on a surface of the substrate,
- wherein each of the light emitting diode structures comprises:
  - a light emitting diode; and
  - light benders respectively formed adjacent to a side portion of the light emitting diode and on the surface of the substrate, the light bender being configured to refract at least a portion of light emitted from the light emitting diode.

15. The light source of claim 14, wherein each of the two light emitting diode structures is adapted to emit a different color of light.

16. The light source of claim 14, wherein each of the light benders is formed of a photonic band gap structure.

17. The light source of claim 14, wherein a side portion of one of the light emitting structures is tapered.

18. The light source of claim 17, wherein the tapered side portion forms an acute angle with the surface of the substrate.

19. The light source of claim 17, wherein the tapered side portion is at least partially covered with a light refracting layer.

20. The light source of claim 19, wherein the light refracting layer is selected from a group consisting of silicon oxide, silicon nitride, and a combination of silicon oxide and silicon nitride.

21. The light source of claim 14, wherein one of the light benders is configured to emit light.

22. The light source of claim 14, further comprising a light absorbing layer formed on a surface of the substrate opposite to the surface upon which the light emitting diode structures are formed.

23. The light source of claim 14, further comprising a light reflector formed on the surface of the substrate and interposed between the two light emitting diode structures and configured to reflect and thereby redirect laterally emitted light from the two light emitting diode structures.

24. The light source of claim 23, wherein the light reflector comprises:
- an inner body including a layer corresponding to a layer in one of the two light emitting diodes; and
- a light reflecting layer on the inner body.

25. A light source comprising:
- a substrate;
- at least two light emitting diodes deposited on a surface of the substrate; and
- a light reflector formed on the surface of the substrate and adjacent to one of the two light emitting diodes, the light reflector having an inner body being deposited simultaneously with at least one layer of the at least two light emitting diodes, the light reflector being configured to redirect at least a portion of emitted light from at least one of the two light emitting diodes.

26. The light source of claim 25, wherein the light reflector further comprises a light reflecting layer covering at least a portion of the inner body.

* * * * *